United States Patent [19]

Bohr et al.

[11] 4,409,259
[45] Oct. 11, 1983

[54] MOS DYNAMIC RAM CELL AND METHOD OF FABRICATION

[75] Inventors: Mark T. Bohr, Beaverton; Kenneth K. Yu, Portland; Ronald J. C. Chwang, Beaverton; C. Neil Berglund, Lake Oswego, all of Oreg.

[73] Assignee: Intel Corporation, Santa Clara, Calif.

[21] Appl. No.: 403,116

[22] Filed: Jul. 29, 1982

Related U.S. Application Data

[62] Division of Ser. No. 182,870, Sep. 2, 1980, Pat. No. 4,364,075.

[51] Int. Cl.$^3$ .................. H01L 29/78; H01L 27/02; B05D 5/12
[52] U.S. Cl. ........................... 427/38; 427/79
[58] Field of Search .................... 427/38, 79

[56] References Cited
U.S. PATENT DOCUMENTS 4,158,238 6/1979 Erb .................... 357/23 C Primary Examiner—James R. Hoffman
Attorney, Agent, or Firm—Blakely, Sokoloff, Taylor & Zafman

[57] ABSTRACT

A high density CMOS dynamic RAM cell comprising a transistor and capacitance means formed in an n-well is disclosed. The capacitance means includes a polysilicon plate member disposed above a p-type region formed in the n-well. A buried contact, extending from the plate member, pierces the p-type region and contacts the well. In addition to the capacitance associated with the plate member, p-type region and well, capacitance is obtained between the side walls of the n-type regions and p-type regions.

4 Claims, 9 Drawing Figures

MOS DYNAMIC RAM CELL AND METHOD OF FABRICATION

This is a division of application Ser. No. 182,870, filed Sept. 2, 1980 now U.S. Pat. No. 4,364,075.

BACKGROUND OF THE INVENTION

1. Field of the Invention

The invention relates to the field of MOS dynamic RAM cells, particularly those compatible with CMOS processing.

2. Prior Art

For the most part, commercial metal-oxide-semiconductor (MOS), random-access memories (RAMs) are fabricated with memory cells consisting of a single transistor and a capacitor. A typical prior art version of this cell is described in U.S. Pat. No. 3,387,286.

The present invention discloses a dynamic RAM cell, compatible with complementary MOS (CMOS) processing which consists of a single transistor and a capacitance means. The cell has several advantages over the prior art, including the fact that it is fabricated with substantially fewer field oxide regions, thus providing higher density.

One advantage to the described cell is its high immunity to alpha particles. In typical n-channel dynamic RAMS, particularly higher density RAMs (e.g. 16K, 64K and 256K), incident alpha particles cause ionization within the substrate. Minority carriers then drift into active regions (storage capacitors and sensing bit line) causing failures. The present cell which is fabricated in an n-type well, has high immunity to these minority carriers because of the barrier produced at the interface between the well and substrate, thus protecting both the signal charge in the storage capacitor and the sensing bit lines.

SUMMARY OF THE INVENTION

A metal-oxide-semiconductor (MOS), dynamic RAM cell fabricated in an n-type well on a p-type silicon substrate is described. The cell includes a transistor for providing selective coupling to a storage capacitor. The storage capacitor includes a plate member formed above the well with an insulating layer between them. A p-type region is disposed within the well below the plate member. An n-type buried contact region disposed within the p-region extends through the p-region and connects the plate member to the well, the n-type buried contacts provides electrical isolation among adjacent cells, and couple the plate member to the well potential. Substantial capacitance is obtained between the p-type region and the substrate and plate member, also capacitance is obtained between the buried contact region and p-type region (side wall). The resultant cell has high immunity to alpha particles and may be fabricated with a minimum of substrate area.

DETAILED DESCRIPTION OF THE INVENTION

An MOS dynamic RAM cell formed with a CMOS process is described. In the following description, numerous specific details are set forth such as doping levels and thicknesses of various layers, in order to provide a thorough understanding of the present invention. It will, however, be obvious to one skilled in the art that the present invention may be practiced without these specific details. In other instances, well-known processing steps and structures have not been described in detail in order not to obscure the present invention in unnecessary detail.

Figure 1:
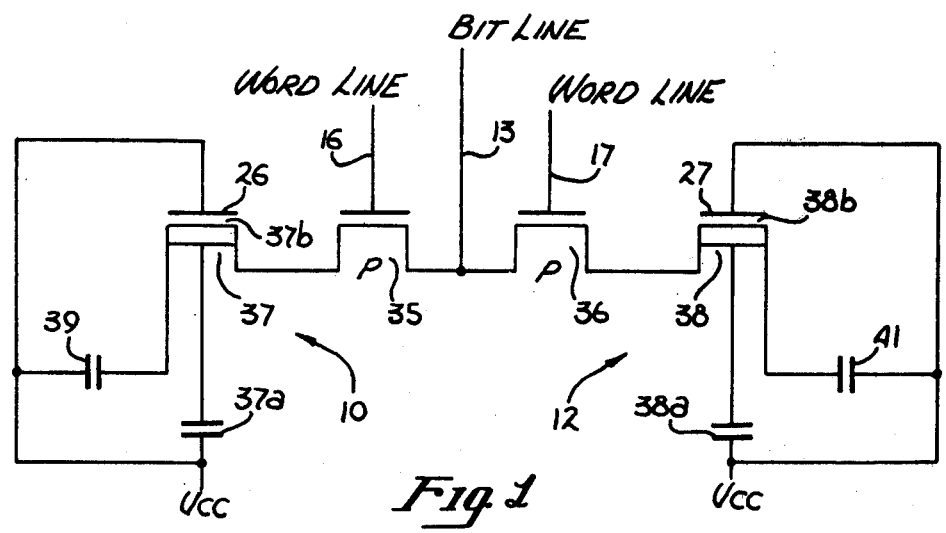
FIG. 1 is an electrical schematic used to illustrate an equivalent circuit for a pair of memory cells fabricated in accordance with the present invention.

Referring first to FIG. 1, the memory cells in the presently preferred embodiment are fabricated in pairs, each pair of which is coupled to a bit line such as bit line 13. The cell 10 includes a p-channel transistor 35 which selectively couples a storage capacitor to the bit line 13 when a potential is applied to the word line 16. Similarly, for the cell 12, p-channel transistor 36 couples a storage capacitor to the bit line 13 when a potential is applied to the word line 17. The storage capacitors for the equivalent circuit of FIG. 1 are shown as depletion mode transistors 37 and 38. As will be described in greater detail, the gate or plate 26 of transistor 37 is coupled through a buried contact region to an n-type well, and both the well and plate are maintained at $V_{CC}$. A capacitance is thus obtained between the plate 26 and the p-type channel region of the transistor 37 shown as capacitor 37b. Substantial capacitance is obtained at the junction between the p-type channel region of transistor 37 and the n-type well. This is shown as capacitor 37a in the equivalent circuit. The side wall between the channel region and the buried contact region also provides some capacitance for the cell (in the order of 20-25%). This capacitance is shown as capacitor 39. Similarly, for the cell 12, transistor 38 provides capacitors 38a and 38b; and the side wall capacitance is illustrated as capacitor 41.

Figure 2:
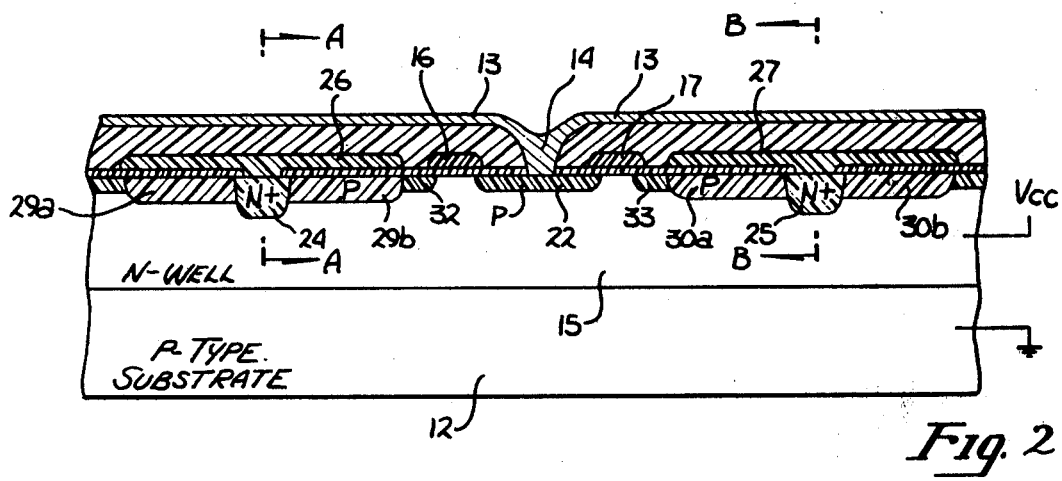
FIG. 2 is a cross-sectional elevation view of a pair of memory cells fabricated in accordance with the present invention.

Referring to FIG. 2, the equivalent circuit of FIG. 1 is formed by the regions shown between section lines AA and BB. (The fabrication of this structure shall be described in conjunction with FIGS. 4 through 9). The bit line 13 of FIG. 1 is shown as a metal line 13 contacting region 22 through contact 14. Region 22 forms a common source/drain region for transistors 35 and 36. The p-channel transistor 35 is defined between regions 32 and 22, and transistor 36 between regions 33 and 22.

The plate member 26 of FIG. 1 consists of an elongated polysilicon line (best seen in FIG. 3 where two rows of cells are shown) which contacts the n-well 15 through a buried contact region, region 24. The side wall capacitance (capacitor 39) is formed between the region 24 and the region 29b. Similarly, for cell 12, the capacitor 41 is formed between the p-type region 30a and the n-type region 25. The capacitor 37b of cell 10 is formed between the polysilicon member 26 and the region 29b. The capacitor 37a is formed by the junction between region 29b and the n-type well 15. The corresponding regions for cell 12 form the capacitors 38a and 38b.

Figure 3:
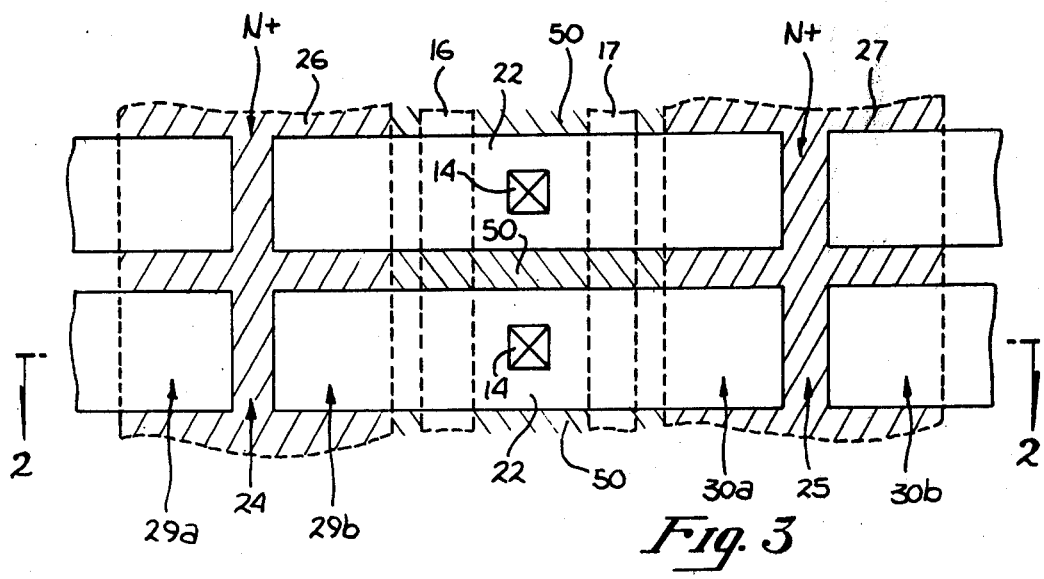
FIG. 3 is a plan view of the cells of FIG. 2 without overlying metal lines.

When the invented cells are formed in an array, the polysilicon members 26 and 27 and regions 24 and 25 of FIG. 2 are shared with adjacent cells. One such cell is located to the left of the section line AA of FIG. 2 (sharing member 26 and region 24) and the other lies to the right of section line BB (sharing member 27 and region 25). These other cells are also coupled to the bit line 13. In the column direction in the array, the elongated polysilicon lines 26 and 27 form plates members for other cells as is best seen in FIG. 3. Similarly, the word lines 16 and 17 are defined from elongated polysilicon members and form word lines for other cells along the same column in the array.

Figure 4:
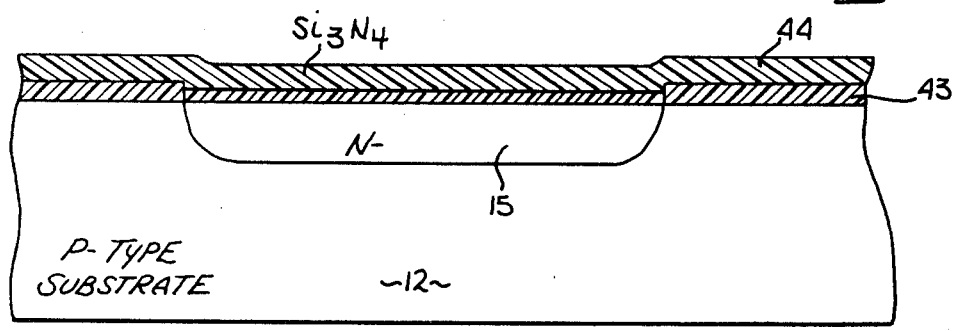
FIG. 4 is a cross-sectional elevational view of a substrate which includes an n-type well.

In the fabrication of the invented cell with the presently preferred process, a p-type silicon substrate 12 shown in FIG. 4 is used. This substrate is doped to a level of 38 to 63 ohm-cm. The "front end" processing includes the formation of a plurality of n-type wells 15. These wells are used as host regions for the RAM cells, and simultaneous with their formation other n-type wells are formed for the peripheral CMOS circuits. Diffusion and driver steps form the phosphorous doped n-type wells to a depth of approximately 5 microns. In this front end processing, an oxide layer 43 is grown over the wells 15, followed by the formation of a silicon nitride layer 44. The specific process used to form the wells 15, channel stop regions and overlying field oxides is described in detail in copending application Ser. No. 133,580, filed Mar. 24, 1980 entitled CMOS PROCESS now U.S. Pat. No. 4,282,648. This application is assigned to the assignee of the present application. Channel stops and field oxides are formed in the array at regions 50 illustrated in FIG. 3. Also channel stops and field oxide regions are simultaneously formed for the peripheral circuits.

Figure 5:
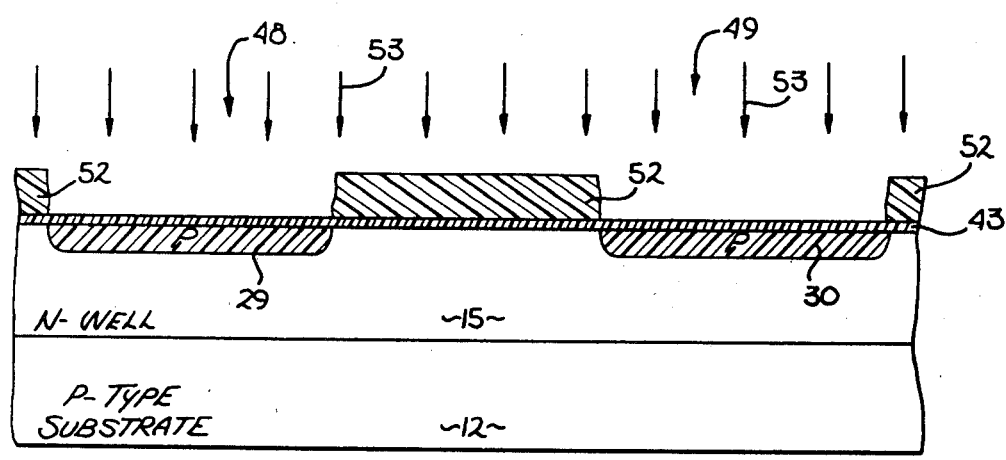
FIG. 5 illustrates the substrate of FIG. 4 after the formation of a pair of p-type regions in the substrate.
Figure 6:
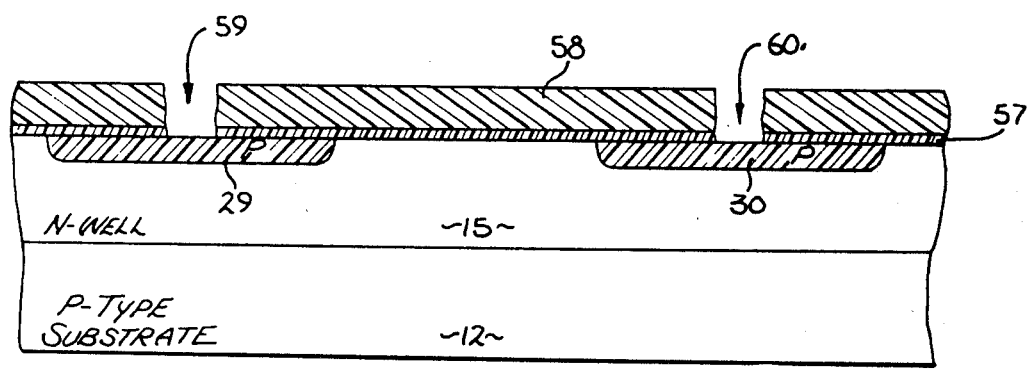
FIG. 6 illustrates the substrate of FIG. 6 after additional processing used to define openings through a photoresist layer, which openings are in contact with the p-type regions.

In the cross-sectional elevation view of FIG. 5, a single n-type well 15 is illustrated in the substrate 12. After the formation of the well, and the removal of the silicon nitride layer 44 of FIG. 4, a photoresist layer 52 is deposited over the oxide layer 43. Then, through ordinary photolithographic techniques, openings 48 and 49 (FIG. 5) are formed through the layer 52 exposing underlying regions of the oxide 43. Next, the substrate is subjected to ion implantation illustrated by lines 53. This forms the p-type regions 29 and 30. Specifically, a boron implant is employed at an energy level of 50 KEV to obtain a concentration level of $4 \times 10^{13}$ cm$^{-2}$ followed by a driver step at a 1000° C. for one hour.

Following this, the remainder of the photoresist layer 52 is removed along with the oxide layer 43. A new gate oxide layer is grown (HCl grown) to a thickness of approximately 350 Å in the presently preferred embodiment. This is shown as oxide layer 57 in FIG. 6. Also in the presently preferred embodiment, the array is subjected to a light boron ion implantation (sheet implant) to adjust the threshold voltage of the devices in the array. This implant is done at an energy level 50 KEV to a dopant concentration level of $7 \times 10^{11}$ cm$^{-2}$.

Now a photoresist layer 58 is formed over the oxide layer 57 and openings 59 and 60 are formed using ordinary photolithographic techniques. The oxide layer 57 is etched at these openings to expose areas of the underlying p-type regions 29 and 30. The openings 59 and 60 bisect the regions 29 and 30.

Figure 7:
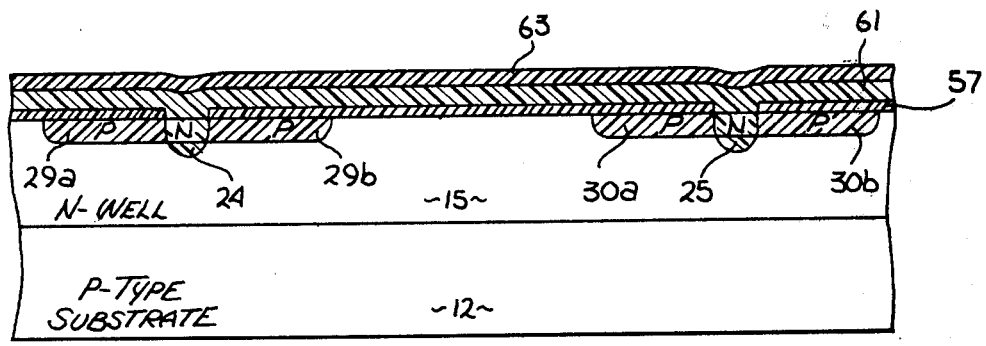
FIG. 7 illustrates the substrate of FIG. 6 after a polysilicon layer has been formed over the substrate and n-type dopant has been driven through the p-type regions into contact with the well.
Figure 8:
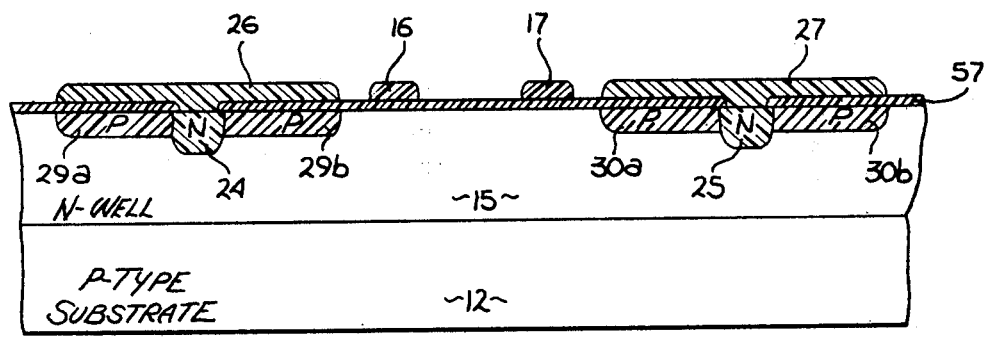
FIG. 8 illustrates the substrate of FIG. 7 after patterns have been formed from the polysilicon layer.

Next, after removal of the photoresist layer 58, a polycrystalline silicon (polysilicon) layer 61 is formed over the substrate. As illustrated in FIG. 7, this layer contacts the regions 29 and 30 since openings were formed in the oxide layer 57 in the step illustrated in FIG. 6. This polysilicon layer in the presently preferred embodiment, is approximately 5000 Å thick and is heavily doped with an n-type dopant, specifically phosphorous. An oxide layer 63 is grown on the polysilicon layer 61 as illustrated in FIG. 7. This step and other subsequent high temperature processing steps causes the n-type dopant from the polysilicon layer 61 to be driven through the regions 29 and 30 into contact with the n-type well forming a contact region 24 in region 29 and a contact region 25 in region 30. Region 24 divides region 29 into regions 29a and 29b; similarly, region 25 divides region 30 into regions 30a and 30b. For sake of simplicity, regions 24 and 25 are shown in FIG. 7 driven into the well 15 even though in actual practice these regions are not fully formed until additional diffusion occurs during subsequent high temperature steps.

Now as illustrated in FIG. 7, the polysilicon layer 61 is patterned using ordinary photolithographic techniques to form the lines 26 and 27 (plate members) and the word lines 16 and 17.

At this point in the processing, a heavy arsenic implant is used to form the source and drain regions for the n-channel transistors of the CMOS peripheral circuits. This implant is not used in the array.

Figure 9:
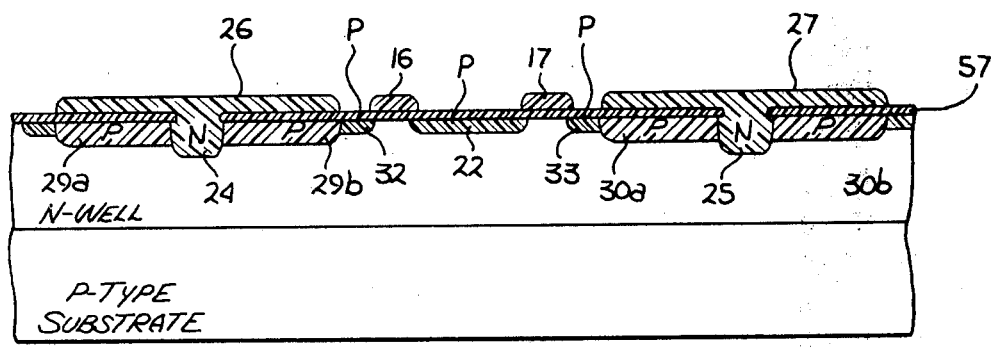
FIG. 9 illustrates the substrate of FIG. 8 after an additional doping step.

The array and peripheral circuits are now subjected to a boron implant to form the source and drain regions for the p-channel devices, specifically regions 22, 32, and 33 of FIG. 9 are doped. These regions are formed in alignment with the lines 16 and 17 and the plate members 26 and 27. A boron implant is used at an energy level of 50 KEV to obtain a dopant concentration of $1 \times 10^{14}$ cm$^{-2}$.

Now well-known steps are used to complete the cells such as the formation of protective glass over the substrate and the fabrication of the metal bit lines and contacts to produce the structure shown in FIG. 2. The plate members 26 and 27 along with the n-type wells 15 are coupled to a positive potential of 5 volts (relative to the substrate).

Importantly, the regions 24 and 25 since they bisect regions 29 and 30 respectively, forming the regions 29a, 29b, 30a, and 30b, provide isolation between adjacent cell pairs. These contact regions, of course, perform the important function of coupling the plate members 26 and 27 to the n-type well. Also, these regions provide additional storage capacitance from their side walls (for example, capacitor 39 of FIG. 1). Often in the prior art, field oxides are grown in the regions occupied by regions 24 and 25. These oxides obviously consume considerable substrate area and do not add to the capacitance of the cells. Additionally, with the plate member 26 and 27 being low resistance polysilicon, the n-type well clamped by the plate members reduces noise coupling between storage cells and bit lines and improve circuit operation. The above described cell is relatively easy to fabricate since among other reasons only a single layer of polysilicon is required. (Often, in prior art dynamic RAM cells, two layers of polysilicon are used.)

Thus, a high density dynamic RAM cell has been described which is fabricated employing CMOS processing. The cell, because of the CMOS processing, has a high immunity to failures associated with alpha particles.

We claim:

1. A process for forming a pair of storage capacitors in an n-type well for use in dynamic memory cells, comprising the steps of:

forming a p-type region in said well;

forming a polysilicon layer over said p-type region, said layer being doped with an n-type dopant and contacting said p-type region at a predetermined area;

driving said n-type dopant from said polysilicon layer at said predetermined area through said p-type region so as to separate said p-type region into a first and a second p-type region separated by an n-type region;

whereby two storage capacitors are formed.

2. The process defined by claim 1 wherein said step of forming said p-type region comprises ion implantation with boron.

3. The process defined by claim 1 wherein said polysilicon layer is patterned to form plates over said first and second regions and wherein other areas of said layer are patterned into gate members for transistors.

4. The process defined by claim 3 including a doping step to form p-type source and drain regions for said transistors; one of said source and drain regions being formed contiguous with said first and second regions.

* * * * *